(12) United States Patent
Arata et al.

(10) Patent No.: US 10,809,017 B2
(45) Date of Patent: Oct. 20, 2020

(54) HEAT SINK WITH PROJECTION AND RECESS SHAPED FINS

(71) Applicant: Mitsubishi Electric Corporation, Tokyo (JP)

(72) Inventors: Kazuki Arata, Tokyo (JP); Masayoshi Tamura, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 80 days.

(21) Appl. No.: 16/093,727

(22) PCT Filed: May 10, 2016

(86) PCT No.: PCT/JP2016/063858
§ 371 (c)(1),
(2) Date: Oct. 15, 2018

(87) PCT Pub. No.: WO2017/195270
PCT Pub. Date: Nov. 16, 2017

(65) Prior Publication Data
US 2019/0137195 A1     May 9, 2019

(51) Int. Cl.
*F28F 3/02* (2006.01)
*H05K 7/20* (2006.01)
(Continued)

(52) U.S. Cl.
CPC .............. *F28F 3/022* (2013.01); *F28F 3/048* (2013.01); *F28F 3/12* (2013.01); *H05K 7/20* (2013.01); *F28D 2021/0029* (2013.01)

(58) Field of Classification Search
CPC .. F28F 3/022; F28F 3/048; F28F 3/12; H05K 7/20; F28D 2021/0029
See application file for complete search history.

(56) References Cited

U.S. PATENT DOCUMENTS 5,582,245 A     12/1996  Niimi
2004/0118579 A1*  6/2004  McCutcheon ...... F28D 15/0241
                                                    174/16.3
(Continued)

FOREIGN PATENT DOCUMENTS

DE   10 2010 000 875 A1    7/2011
JP        09-138091 A       5/1997
(Continued)

OTHER PUBLICATIONS

Communication dated Apr. 26, 2019, from the European Patent Office in counterpart European Application No. 16901619.3.
(Continued)

*Primary Examiner* — Ljiljana V. Ciric
(74) *Attorney, Agent, or Firm* — Sughrue Mion, PLLC; Richard C. Turner

(57)  ABSTRACT

A heat sink includes a plurality of heat-radiating fins provided on a base, wherein the heat-radiating fins each have a projection-and-recess shape in which a sectional shape along the base is inscribed in a regular hexagon, wherein projections of the projection-and-recess shape are held in contact with the regular hexagon. In adjacent heat-radiating fins, sides of the regular hexagon, with which the projections are held in contact, are opposed to each other in an entire region. The heat-radiating fins are arranged so that distances between the sides opposed to each other at a distance are equal.

16 Claims, 10 Drawing Sheets

(51) Int. Cl.
*F28F 3/04* (2006.01)
*F28F 3/12* (2006.01)
*F28D 21/00* (2006.01)

(56) References Cited

U.S. PATENT DOCUMENTS

| | | | |
|---|---|---|---|
| 2007/0053168 A1* | 3/2007 | Sayir | H01L 23/3672 |
| | | | 361/718 |
| 2009/0151900 A1* | 6/2009 | Huang | H01L 23/467 |
| | | | 165/80.3 |
| 2010/0207502 A1* | 8/2010 | Cao | F21V 29/51 |
| | | | 313/46 |
| 2014/0054762 A1 | 2/2014 | Nagaune | |
| 2014/0138063 A1 | 5/2014 | Kawaura et al. | |
| 2015/0377717 A1 | 12/2015 | Rollin et al. | |
| 2016/0146405 A1* | 5/2016 | Kim | F21K 9/232 |
| | | | 362/249.02 |
| 2017/0102194 A1* | 4/2017 | Choi | H05K 7/20218 |
| 2017/0248379 A1* | 8/2017 | Kadijk | F21V 29/81 |
| 2018/0000255 A1* | 1/2018 | Youngblood | A47C 21/022 |
| 2018/0024599 A1* | 1/2018 | Sakata | H01L 23/473 |
| | | | 361/679.47 |
| 2018/0142964 A1* | 5/2018 | Reilly | F28D 21/00 |
| 2018/0142965 A1* | 5/2018 | Onda | F28D 21/00 |
| 2019/0331428 A1* | 10/2019 | Arata | F28D 15/00 |
| 2019/0335614 A1* | 10/2019 | Nozaki | H05K 7/20172 |
| 2020/0008316 A1* | 1/2020 | Cola | F28F 21/06 |

FOREIGN PATENT DOCUMENTS

| | | |
|---|---|---|
| JP | 09-252066 A | 9/1997 |
| JP | 2003-188322 A | 7/2003 |
| JP | 2004-103734 A | 4/2004 |
| JP | 3840970 B2 | 11/2006 |
| JP | 2012-227367 A | 11/2012 |
| JP | 2013-120897 A | 6/2013 |
| JP | 2013-138193 A | 7/2013 |
| JP | 6132869 B2 | 5/2017 |
| WO | 2012/157247 A1 | 11/2012 |

OTHER PUBLICATIONS

International Search Report for PCT/JP2016/063858, dated Jul. 5, 2016.
Notice of Reasons for Refusal dated Aug. 20, 2019 issued by the Japanese Patent Office in counterpart application No. 2018-516245.
Japanese Office Action issued in Application No. 2018-515911 dated Mar. 12, 2019.

* cited by examiner

HEAT SINK WITH PROJECTION AND RECESS SHAPED FINS

CROSS REFERENCE TO RELATED APPLICATIONS

This Application is a National Stage of International Application No. PCT/JP2016/063858 filed May 10, 2016.

TECHNICAL FIELD

The present invention relates to a heat sink configured to cool, for example, heat-generating elements.

BACKGROUND ART

SiC is high in cost, and therefore, chip shrink is required for elements using SiC. As a result, heat generating density of the elements is increased, and the elements are increased in temperature. In view of this, a heat sink having high heat radiation performance has been demanded.

The heat radiation performance of the heat sink is enhanced as a heat radiation area per unit volume of the heat-radiating fins of the heat sink is increased. The heat radiation area per unit volume of the heat-radiating fins is increased as a distance of a gap between the adjacent heat-radiating fins is smaller. However, in order to prevent clogging of foreign matters such as dust in the gap between the adjacent heat-radiating fins, a lower limit value is set for the distance of the gap between the adjacent heat-radiating fins depending on a usage environment of the heat sink in some cases. Therefore, increase in heat radiation area per unit volume of the heat-radiating fins within the limitation by the gap between the adjacent heat-radiating fins is a key for enhancing the heat radiation performance of the heat sink. Further, as a method for enhancing the heat radiation performance of the heat sink, there is given a method of thinning a temperature boundary layer formed on surfaces of the heat-radiating fins.

Hitherto, there has been known a heat sink in which a plurality of heat-radiating fins each having a sectional shape of a regular hexagon are arrayed regularly. In this heat sink, in each of the heat-radiating fins, a side wall surface forming a first side of the regular hexagon and a side wall surface forming a fourth side opposed to the first side are arranged in parallel to each other along a first direction being an air direction. A side wall surface forming a second side and a side wall surface forming a fifth side opposed to the second side are arranged in parallel to each other along a second direction forming an angle with respect to the first direction between a second side adjacent to the first side of the regular hexagon and the first side. A side wall surface forming a sixth side and a side wall surface forming a third side opposed to the sixth side are arranged in parallel to each other along a third direction forming an angle with respect to the first direction between a sixth side adjacent to the first side of the regular hexagon and the first side. Further, in this heat sink, in each of the heat-radiating fins, for each of the first side to the sixth side of the regular hexagon, a side wall surface of the adjacent heat-radiating fin is arranged on an extended plane of each of the side wall surfaces. (for example, see Patent Literature 1).

CITATION LIST

Patent Literature

[PTL 1] JP 3840970 B2

SUMMARY OF INVENTION

Technical Problem

However, in each of the heat-radiating fins, for each of the first side to the sixth side of the regular hexagon, the side wall surface of the adjacent heat-radiating fin is arranged on the extended plane of each of the side wall surfaces. Therefore, a space between the adjacent heat-radiating fins is increased. As a result, there is a problem in that the heat radiation area per unit volume of the heat-radiating fins is reduced, thereby degrading the heat radiation performance of the heat sink. Further, in each of the heat-radiating fins, the side wall surfaces are formed into flat surfaces. Therefore, there is a problem in that a temperature boundary layer formed on the surfaces of the heat-radiating fins is developed to be thick at the side wall surfaces of the heat-radiating fins, thereby degrading the heat radiation performance of the heat sink.

The present invention provides a heat sink capable of enhancing the heat radiation performance while maintaining a lower limit value of a distance of a gap between adjacent heat-radiating fins.

Solution to Problem

According to one embodiment of the present invention, there is provided a heat sink, including a plurality of heat-radiating fins provided on a base of the heat sink, wherein the heat-radiating fins each have a projection-and-recess shape in which a sectional shape along the base is inscribed in a regular hexagon, wherein projections of the projection-and-recess shape are held in contact with the regular hexagon, and wherein, in the adjacent heat-radiating fins, sides of the regular hexagon, with which the projections are held in contact, are opposed to each other in an entire region, and the heat-radiating fins are arranged so that side-to-side distances being distances between the sides opposed to each other at a distance are equal.

Advantageous Effects of Invention

In the heat sink according to one embodiment of the present invention, the heat-radiating fins each have the projection-and-recess shape in which the sectional shape along the base is inscribed in the regular hexagon. The projections of the projection-and-recess shape are held in contact with the regular hexagon. In the adjacent heat-radiating fins, the sides of the regular hexagon, with which the projections are held in contact, are opposed to each other in the entire region, and the heat-radiating fins are arranged so that the side-to-side distances being the distances between the sides opposed to each other at a distance are equal. With this, the heat radiation performance can be enhanced while maintaining the lower limit value of the distance of the gap between the adjacent heat-radiating fins.

DESCRIPTION OF EMBODIMENTS

First Embodiment

Figure 1:
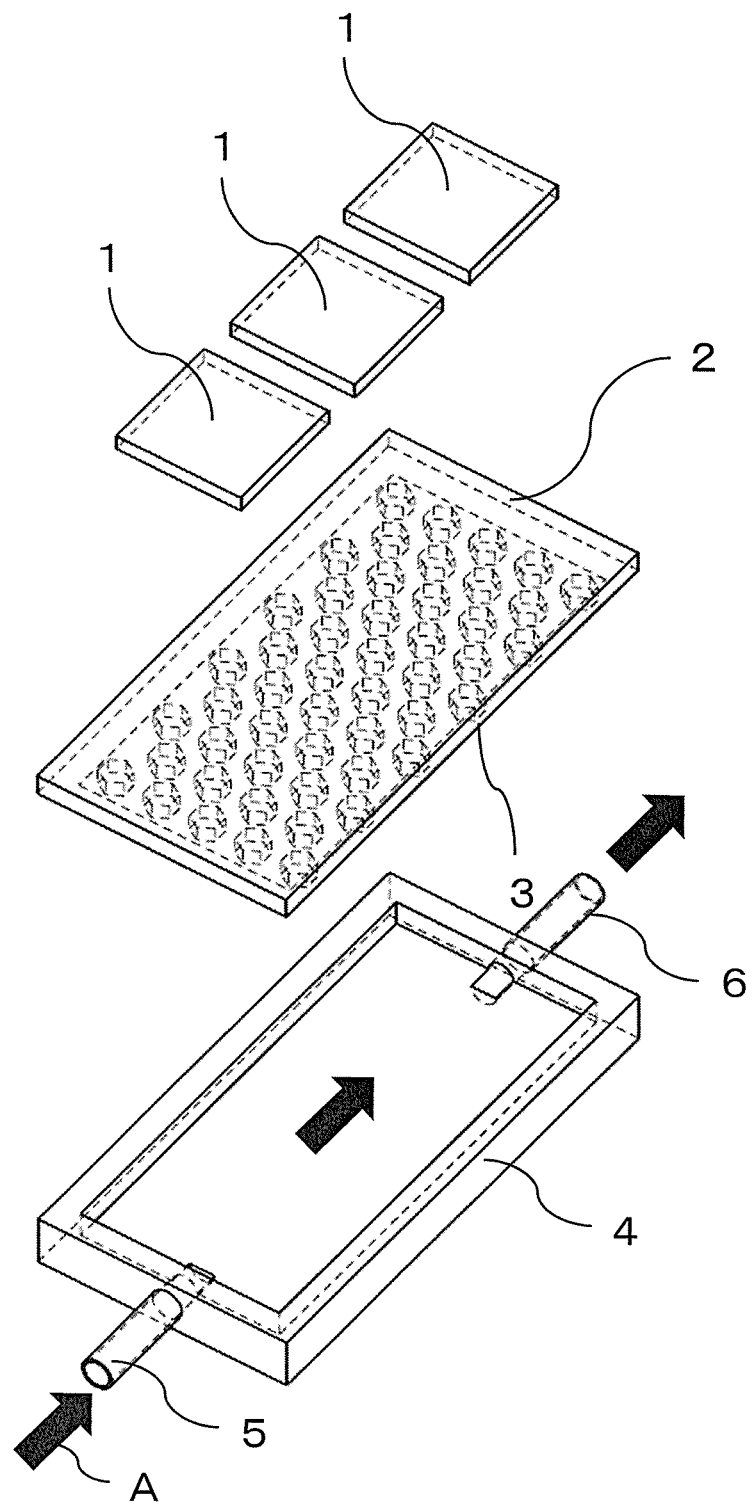
FIG. 1 is an exploded perspective view for illustrating a heat sink according to a first embodiment of the present invention.

FIG. 1 is an exploded perspective view for illustrating a heat sink according to a first embodiment of the present invention. In FIG. 1, the heat sink includes a base 2, a plurality of heat-radiating fins 3, a jacket 4, a refrigerant inlet portion 5, and a refrigerant outlet portion 6. The base 2 has heat-generating elements 1 provided on a top surface thereof. The plurality of heat-radiating fins 3 are provided on a back surface of the base 2. The jacket 4 receives the base 2 therein. The refrigerant inlet portion 5 is provided on a side wall of the jacket 4. The refrigerant outlet portion 6 is provided on a side wall of the jacket 4, which is opposed to the side wall on which the refrigerant inlet portion 5 is provided.

In the heat sink, refrigerant enters the refrigerant inlet portion 5 in a direction indicated by the arrows A of FIG. 1. The refrigerant having entered the refrigerant inlet portion 5 passes through the refrigerant inlet portion 5 to enter a space defined by the jacket 4 and the base 2. In this space, the refrigerant exchanges heat with the heat-radiating fins 3 that receive heat from the heat-generating elements 1. With this, the heat-generating elements 1 are cooled by the heat-radiating fins 3. The refrigerant having received heat through the heat exchange with the heat-radiating fins 3 enters the refrigerant outlet portion 6 as it is. The refrigerant having entered the refrigerant outlet portion 6 passes through the refrigerant outlet portion 6 to be discharged to the outside of the heat sink.

The refrigerant to be used in the heat sink may be any of liquid, gas, and gas-liquid mixture. Further, the jacket 4 may be omitted from the heat sink depending on an environment in which the heat sink is installed.

Figure 2:
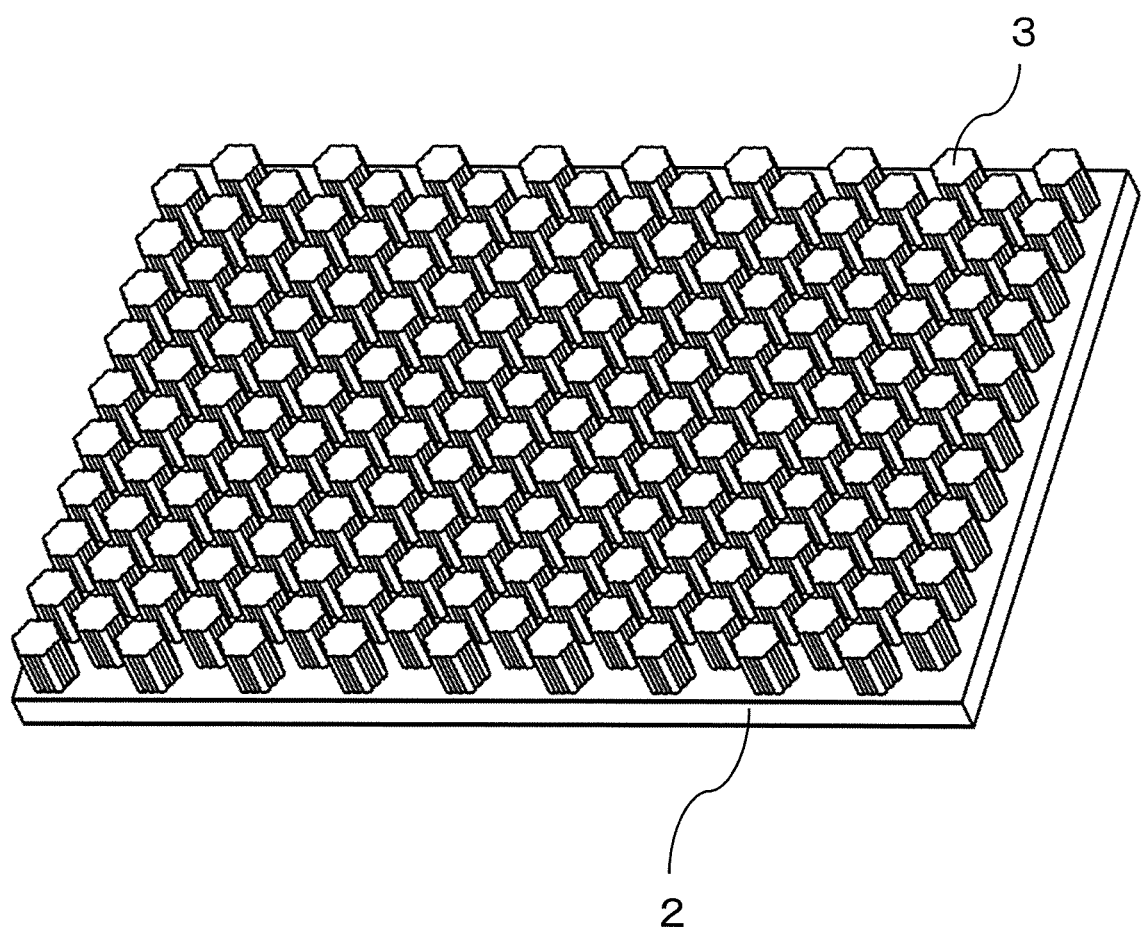
FIG. 2 is a perspective view for illustrating heat-radiating fins and a base of FIG. 1.
Figure 3:
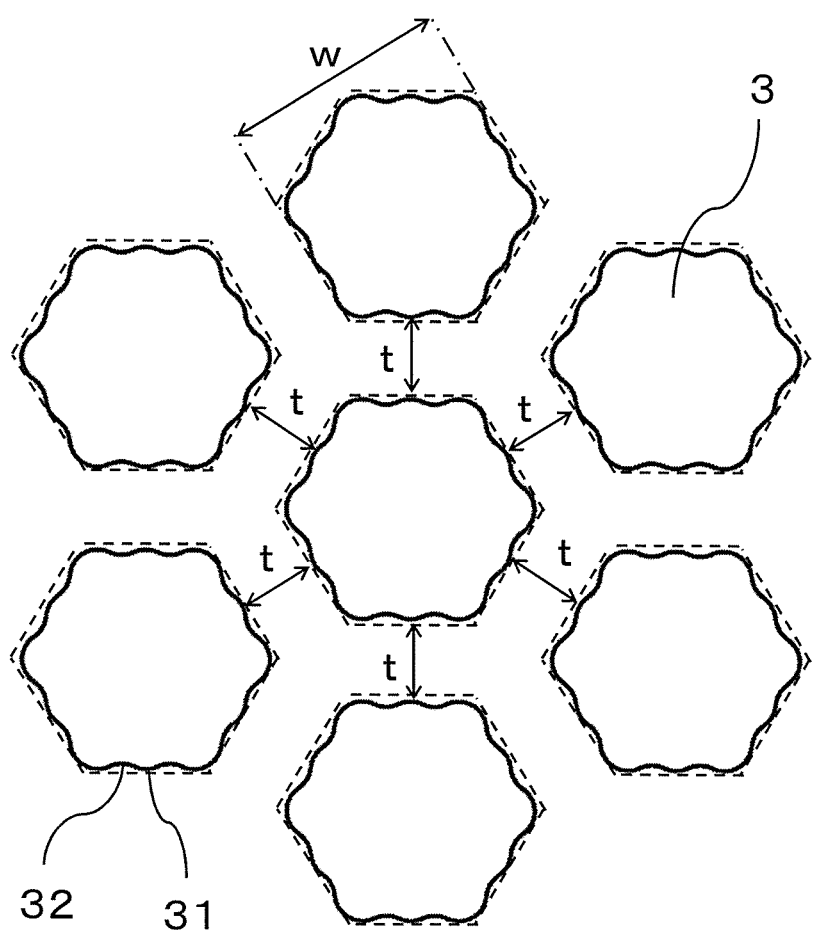
FIG. 3 is an illustration of seven heat-radiating fins of FIG. 2 as viewed in a direction perpendicular to the base.
Figure 4:
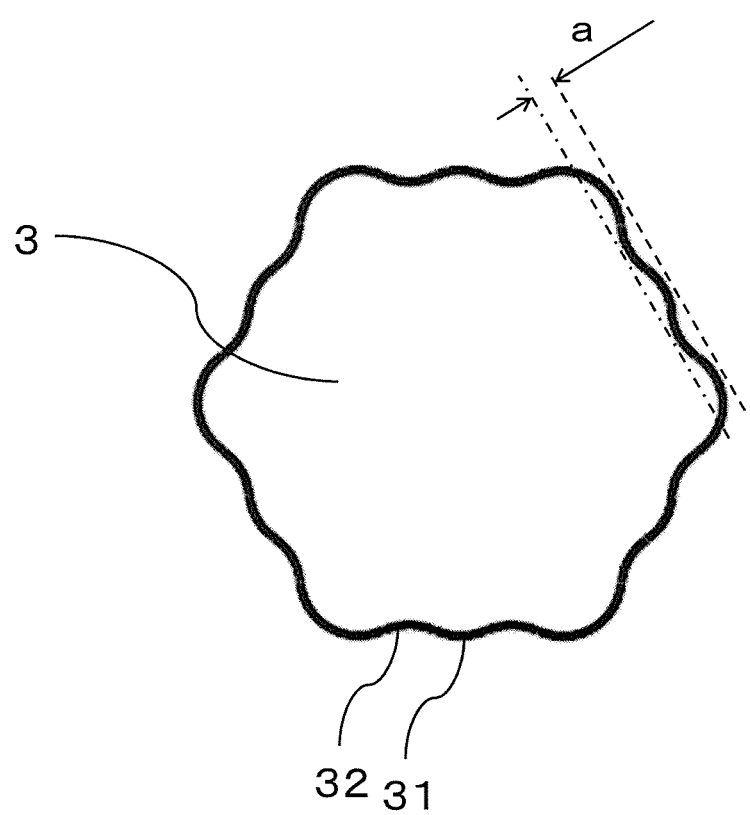
FIG. 4 is an enlarged view for illustrating one heat-radiating fin of FIG. 3.

FIG. 2 is a perspective view for illustrating the heat-radiating fins 3 and the base 2 of FIG. 1. FIG. 3 is an illustration of seven heat-radiating fins 3 of FIG. 2 as viewed in a direction perpendicular to the base 2. FIG. 4 is an enlarged view for illustrating one heat-radiating fin 3 of FIG. 3. The heat-radiating fins 3 are each formed so that a sectional shape thereof along the base 2 is inscribed in a regular hexagon. In FIG. 3, the broken line indicates the regular hexagon circumscribed to the heat-radiating fin 3. A distance between facing sides of the regular hexagon circumscribed to one heat-radiating fin 3 is defined as an opposite side distance "w".

Further, the heat-radiating fin 3 has a projection-and-recess shape in cross section, which is inscribed in the regular hexagon. The heat-radiating fin 3 has projections 31 and recesses 32. The projections 31 are held in contact with the regular hexagon, and the recesses 32 are apart from the regular hexagon. The plurality of recesses 32 are arranged so as to be opposed to the sides of the regular hexagon. A distance between the side of the regular hexagon, which is circumscribed to the heat-radiating fin 3, and a common tangent of the plurality of recesses 32 opposed to the side and adjacent to each other is defined as a recess depth "a". In other words, the recess depth "a" is a distance between a bottom portion of the recess 32 of the projection-and-recess shape and the side of the regular hexagon, with which the projection 31 is held in contact. In FIG. 4, the broken line indicates a line obtained by extending one side of the regular hexagon, and the dashed-dotted line indicates the common tangent of the recesses 32 adjacent to each other.

Six heat-radiating fins 3 are arranged around one heat-radiating fin 3. The six heat-radiating fins 3 are arrayed in a circumferential direction around the one heat-radiating fin 3 as a center. The respective sides of the regular hexagon, which are circumscribed to the one heat-radiating fin 3, are opposed to the respective sides of the regular hexagons, which are circumscribed to the respective heat-radiating fins 3 around the one heat-radiating fin 3.

The sides of the regular hexagon, which are circumscribed to the one heat-radiating fin 3, and the sides of the regular hexagons, which are circumscribed to the respective six heat-radiating fins 3 arranged around the one heat-radiating fin 3, are apart from each other and are opposed to each other in an entire region. A distance between each of the sides of the regular hexagon, which are circumscribed to the one heat-radiating fin 3, and each of the sides of the regular hexagons circumscribed to the six heat-radiating fins 3 arranged around the one heat-radiating fin 3 is defined as a side-to-side distance "t".

The root portion of the heat-radiating fin 3 may be formed so as to have a corner R, in other words, to have roundness. Further, the heat-radiating fin 3 may be formed into a tapered shape, which is tapered as separating from the base 2 in a perpendicular direction. In this case, the side-to-side distance "t" only needs to be a side-to-side distance "t" at an average height of the heat-radiating fins 3 each having a tapered shape. The average height is, for example, a height at an intermediate portion when the heat-radiating fin 3 is inclined linearly. When outer peripheral portions of the plurality of arrayed heat-radiating fins 3 interfere with a flow passage of refrigerant, due to a dimensional limitation, a shape limitation, and the like of the flow passage of the refrigerant, a part of each of the heat-radiating fins 3, which is located at the outer peripheral portion, may be deformed so as to conform to the flow passage shape.

As described above, in the heat sink according to the first embodiment of the present invention, the sides of the regular hexagons, which are circumscribed to the heat-radiating fins 3, are opposed to each other in an entire region at the side-to-side distance "t". Thus, the heat-radiating fins 3 are most densely arranged at the side-to-side distance "t" so that the surface area of the heat-radiating fins 3 is increased. Therefore, even when a limitation of a lower limit value of the side-to-side distance "t", which is imposed so as to prevent clogging of foreign matters such as dust, is set, the heat radiation performance of the heat sink can be enhanced within the limitations. Further, refrigerant collides against the projections 31 of the projection-and-recess shape formed on each of side surfaces of the heat-radiating fin 3. Thus, a flow of the refrigerant is stirred, and a temperature boundary layer is thinned, thereby being capable of further enhancing the heat radiation performance of the heat sink.

Second Embodiment

In the heat-radiating fins 3, when the side-to-side distance "t" is fixed, as the opposite side distance "w" is larger, thermal resistance from the root to the distal end of each of the heat-radiating fins 3 is reduced. Thus, the entire side surfaces of the heat-radiating fins 3 can be used for heat radiation efficiently, that is, fin efficiency is enhanced. However, as the opposite side distance "w" is larger, the number of the heat-radiating fins 3 that can be arranged per unit area is reduced, which results in reduction in heat radiation area of the heat sink.

Meanwhile, in the heat-radiating fins 3, when the side-to-side distance "t" is fixed, as the opposite side distance "w" is smaller, thermal resistance from the root to the distal end of each of the heat-radiating fins 3 is increased. Thus, as approaching the distal end of each of the heat-radiating fins 3, a temperature is lowered, and the side surfaces of the heat-radiating fins 3 only partially contribute to heat radiation, that is, the fin efficiency is degraded. However, as the opposite side distance "w" is smaller, the number of the heat-radiating fins 3 that can be arranged per unit area is increased, which results in increase in heat radiation area of the heat sink.

As described above, in the heat-radiating fins 3, under a condition that the side-to-side distance "t" is constant, depending on the opposite side distance "w", the efficiency of the heat radiation and the heat radiation area have a trade-off relation, and there is an optimum value for the opposite side distance "w".

Figure 5:
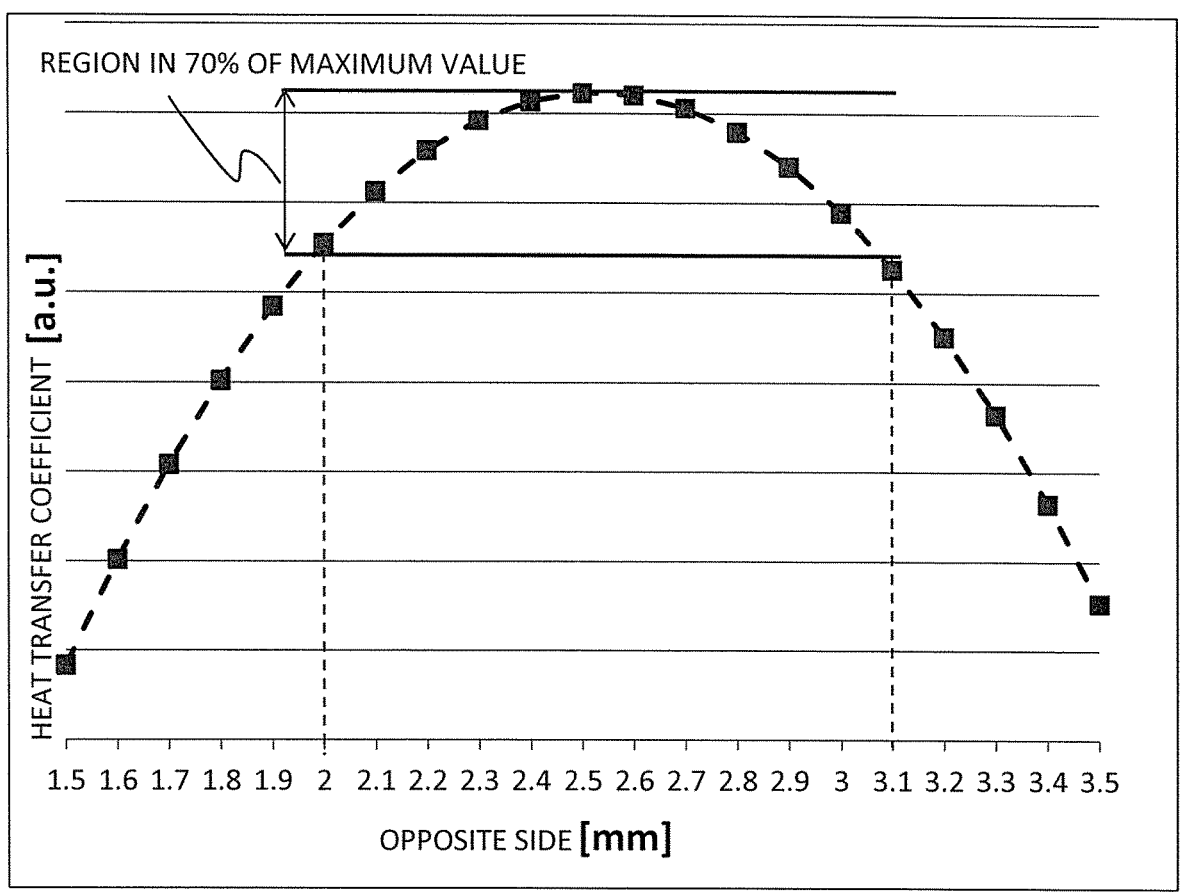
FIG. 5 is a graph for showing a relationship between an opposite side distance of the heat-radiating fin and a heat transfer coefficient.

FIG. 5 is a graph for showing a relationship between the opposite side distance "w" of the heat-radiating fin 3 and a heat transfer coefficient. In FIG. 5, the horizontal axis represents the opposite side distance "w" of the heat-radiating fin 3, and the vertical axis represents the heat transfer coefficient (freely selected unit). In FIG. 5, there is shown a result of performing a three-dimensional thermal fluid simulation under a condition that the side-to-side distance "t", the recess depth "a", a height of the heat-radiating fin 3, and a refrigerant flow rate are fixed.

As shown in FIG. 5, the heat transfer coefficient becomes the maximum when the opposite side distance "w" is around 2.5 mm. When the opposite side distance "w" is set to from 2.0 mm to 3.1 mm, 70% of the maximum value of the heat transfer coefficient can be obtained, thereby being capable of particularly enhancing the heat radiation performance of the heat sink. Configurations other than setting of the opposite side distance "w" to from 2.0 mm to 3.1 mm are the same as those of the first embodiment.

As described above, in the heat sink according to the second embodiment of the present invention, the opposite side distance "w" is from 2.0 mm to 3.1 mm, thereby being capable of particularly enhancing the heat radiation performance.

Third Embodiment

As the recess depth "a" of the heat-radiating fin 3 is larger, the flow of the refrigerant is further stirred at the projections 31 formed on the side surfaces of the heat-radiating fin 3, and an effect of thinning the temperature boundary layer is larger, which results in increase in heat radiation amount of the heat sink. However, as the recess depth "a" of the heat-radiating fin 3 is larger, the refrigerant flow speed is lowered at the recesses 32 in the side surfaces of the heat-radiating fin 3, which results in reduction in heat radiation amount of the heat sink.

Meanwhile, as the recess depth "a" of the heat-radiating fin 3 is smaller, stirring of the flow of the refrigerant is reduced at the projections 31 on the side surfaces, and the effect of thinning the temperature boundary layer is reduced, which results in reduction in heat radiation amount of the heat sink. However, as the recess depth "a" of the heat-radiating fin 3 is smaller, lowering of the refrigerant flow speed is suppressed at the recesses 32 in the side surfaces of the heat-radiating fin 3, which results in increase in heat radiation amount of the heat sink.

As described above, in the heat-radiating fin 3, depending on the recess depth "a", the effect of thinning the temperature boundary layer on the projections 31 and the refrigerant flow speed in the recesses 32 have a trade-off relation, and there is an optimum value for the recess depth "a".

Figure 6:
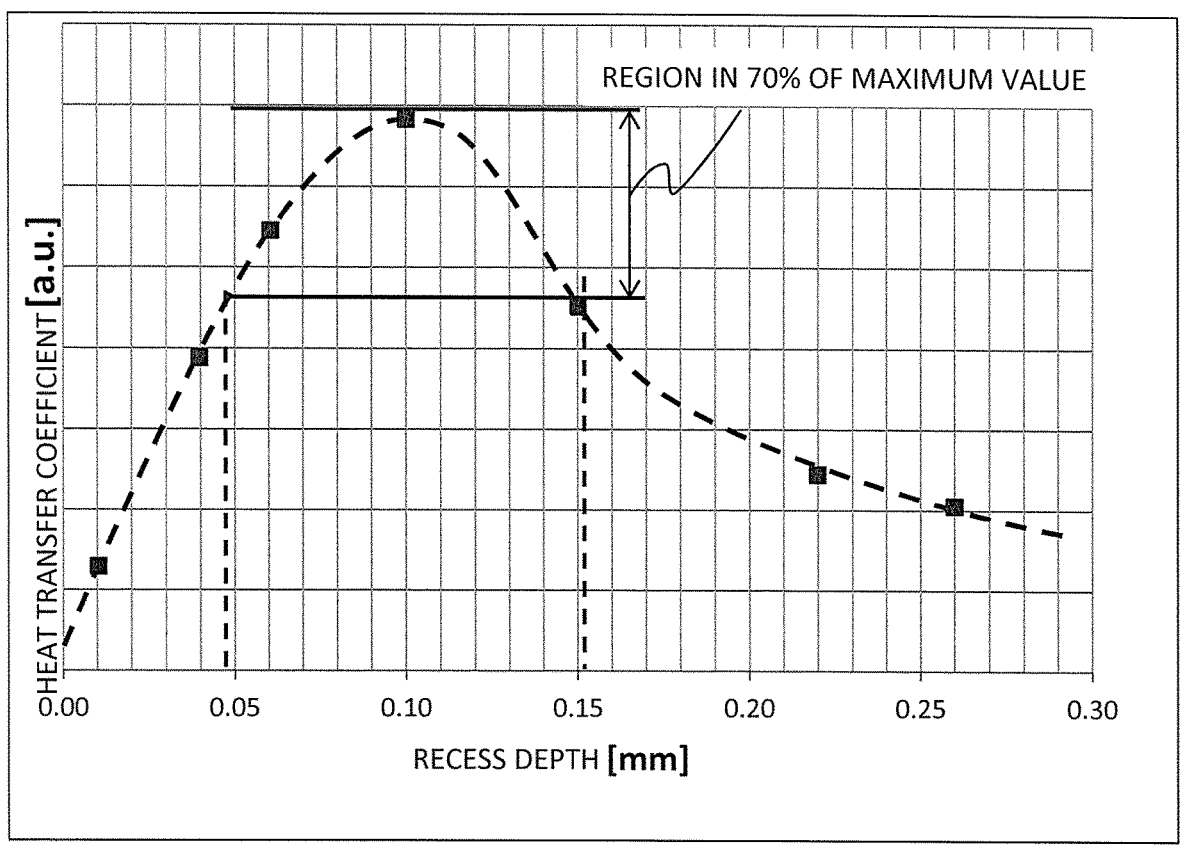
FIG. 6 is a graph for showing a relationship between a recess depth and a heat transfer coefficient.

FIG. 6 is a graph for showing a relationship between the recess depth "a" and a heat transfer coefficient. In FIG. 6, the horizontal axis represents the recess depth "a" of the heat-radiating fin 3, and the vertical axis represents the heat transfer coefficient (freely selected unit). In FIG. 6, there is shown a result of performing a three-dimensional thermal fluid simulation under a condition that the side-to-side distance "t", the opposite side distance "w", a height of the heat-radiating fin 3, and a refrigerant flow rate are fixed.

As shown in FIG. 6, the heat transfer coefficient becomes the maximum when the recess depth "a" is around 0.1 mm. When the recess depth "a" is set to from 0.05 mm to 0.15 mm, 70% of the maximum value of the heat transfer coefficient can be obtained, thereby being capable of particularly enhancing the heat radiation performance of the heat sink. Configurations other than the configuration that setting of the recess depth "a" to from 0.05 mm to 0.15 mm are the same as those of the first embodiment or the second embodiment.

As described above, in the heat sink according to the third embodiment of the present invention, the recess depth "a" is from 0.05 mm to 0.15 mm, thereby being capable of particularly enhancing the heat radiation performance.

Fourth Embodiment

Figure 7:
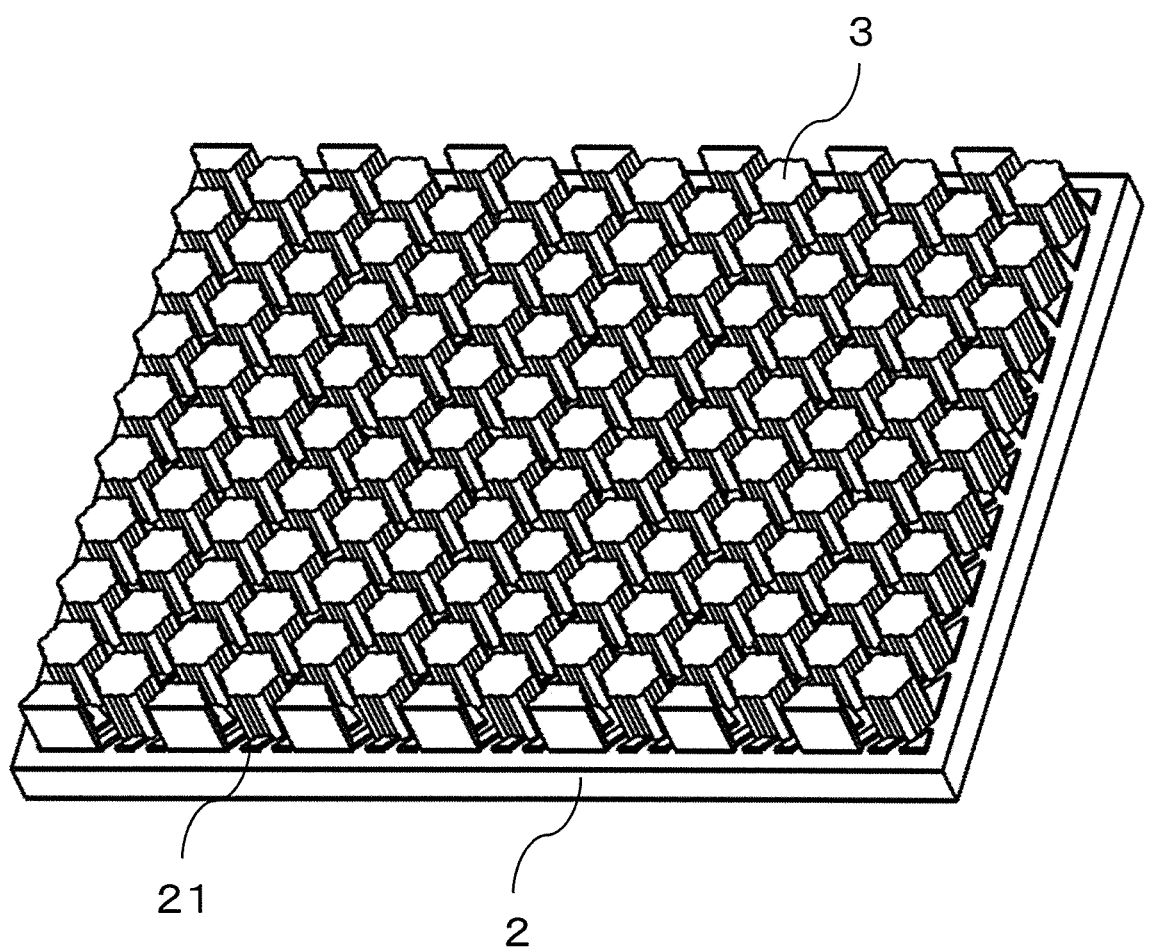
FIG. 7 is a perspective view for illustrating heat-radiating fins and a base of a heat sink according to a fourth embodiment of the present invention.
Figure 8:
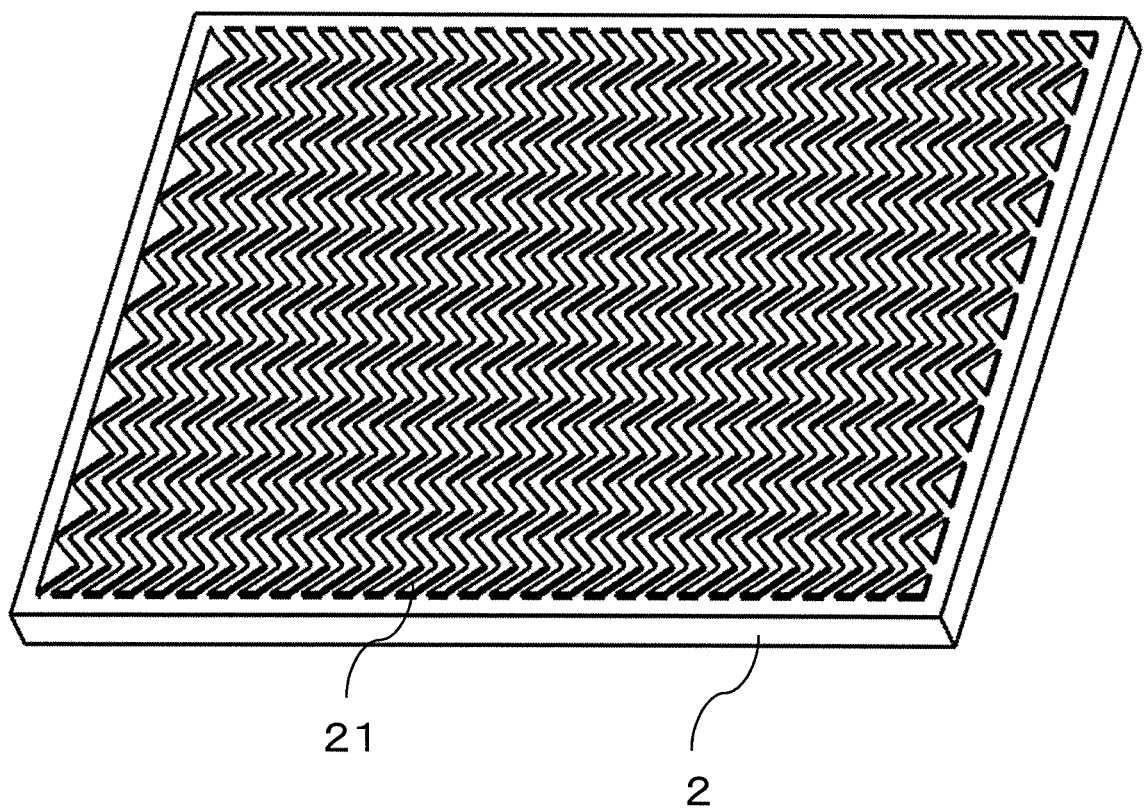
FIG. 8 is a perspective view for illustrating the base in a state in which the heat-radiating fins are removed from the heat sink of FIG. 7.

FIG. 7 is a perspective view for illustrating heat-radiating fins and a base of a heat sink according to a fourth embodiment of the present invention. FIG. 8 is a perspective view for illustrating the base in a state in which the heat-radiating fins are removed from the heat sink of FIG. 7. A projection-and-recess portion 21 having a zig-zag shape is formed on the base 2. With the projection-and-recess portion 21 having a zig-zag shape, the flow of the refrigerant is stirred intricately when the refrigerant passes between the heat-radiating fins 3, a temperature boundary layer formed on the base 2 is thinned, and heat radiation of the heat sink is promoted. Other configurations are the same as those of the first embodiment to the third embodiment.

As described above, in the heat sink according to the fourth embodiment of the present invention, the projection-and-recess portion 21 is formed on the base 2, and the projection-and-recess portion 21 is formed into a zig-zag shape. Thus, a temperature boundary layer formed on the base 2 can be thinned, thereby being capable of further promoting heat radiation.

Fifth Embodiment

Figure 9:
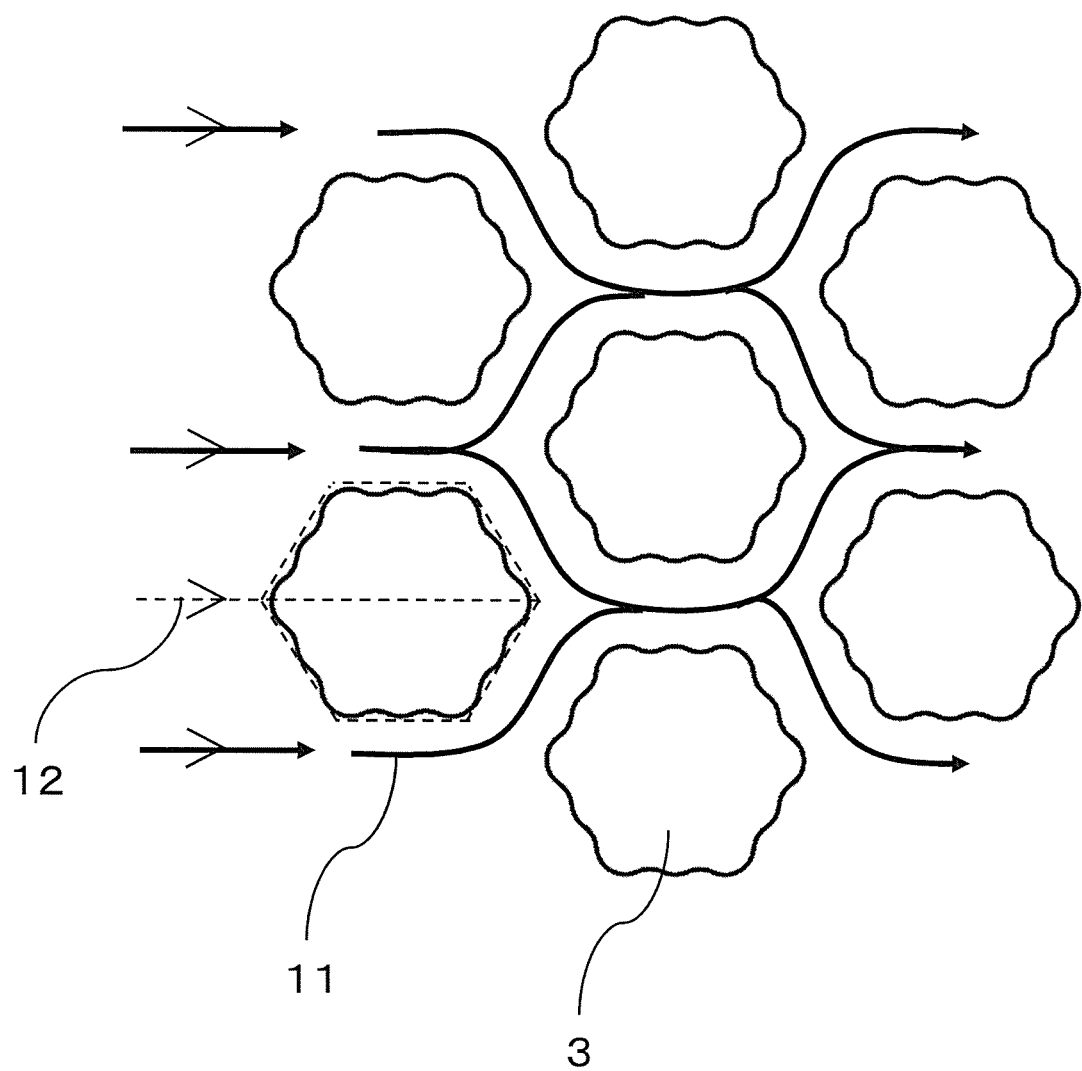
FIG. 9 is a plan view for illustrating a plurality of heat-radiating fins in a heat sink according to a fifth embodiment of the present invention.

FIG. 9 is a plan view for illustrating a plurality of heat-radiating fins in a heat sink according to a fifth embodiment of the present invention. In FIG. 9, the heat-radiating fins 3 as viewed in an axial direction of the heat-radiating fins 3 are illustrated. Further, in FIG. 9, one heat-radiating fin 3 and six heat-radiating fins 3 provided around the one heat-radiating fin 3 are illustrated. Further, in FIG. 9, a flow passage direction 11 of refrigerant passing between the adjacent heat-radiating fins 3 is indicated. In FIG. 9, the refrigerant passing through the heat sink flows in parallel to a straight line 12 connecting apexes of the regular hexagon circumscribed to the heat-radiating fin 3. In other words, the heat-radiating fins 3 are arranged so that the refrigerant flows along the straight line 12 connecting the apexes of the regular hexagon circumscribed to the heat-radiating fin 3. In this case, the straight line 12 connecting the apexes of the regular hexagon circumscribed to the heat-radiating fin 3 is a straight line 12 connecting the respective apexes of the regular hexagon circumscribed to the heat-radiating fin 3, that is, a pair of apexes opposed to each other. The refrigerant is caused to flow in parallel to the straight line connecting the apexes of the regular hexagon circumscribed to the heat-radiating fin 3. With this, as compared to a case in which the refrigerant is caused to flow perpendicularly to the straight line connecting the apexes of the regular hexagon circumscribed to the heat-radiating fin 3, the side surfaces of the heat-radiating fins 3 can be used efficiently for heat radiation.

Figure 10:
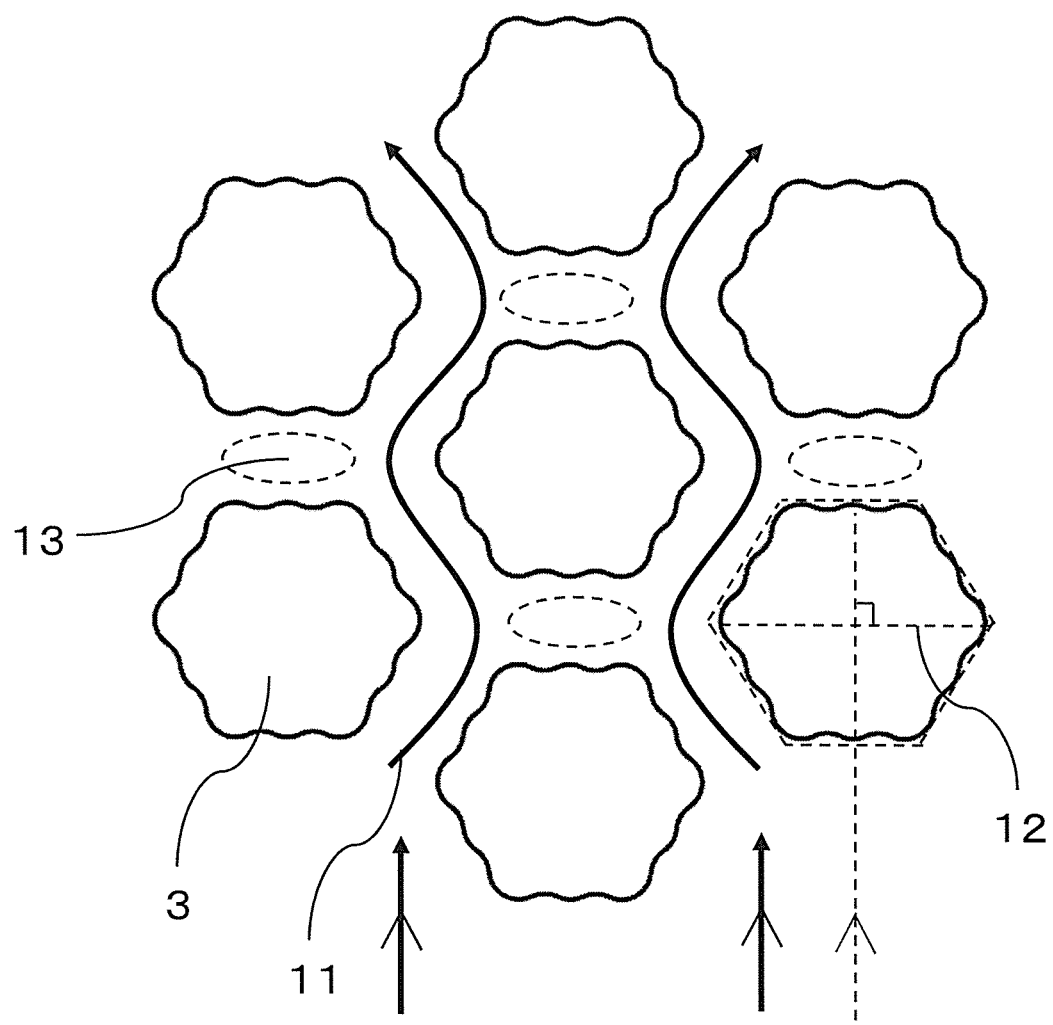
FIG. 10 is an illustration of a state in which refrigerant is caused to flow perpendicularly to a straight line connecting apexes of a regular hexagon circumscribed to the heat-radiating fin.

FIG. 10 is an illustration of a state in which the refrigerant is caused to flow perpendicularly to the straight line connecting the apexes of the regular hexagon circumscribed to the heat-radiating fin 3. As illustrated in FIG. 10, when the refrigerant is caused to flow perpendicularly to the straight line connecting the apexes of the regular hexagon circumscribed to the heat-radiating fin 3, a stagnation region 13 of the refrigerant is generated in a direction orthogonal to the flow of the refrigerant. Sufficient heat radiation does not occur at the side surfaces of the heat-radiating fins 3 adjacent to the stagnation region 13 of the refrigerant. In contrast, as illustrated in FIG. 9, when the refrigerant is caused to flow in parallel to the straight line connecting the apexes of the regular hexagon circumscribed to the heat-radiating fin 3, the stagnation region 13 of the refrigerant is not generated. Therefore, sufficient heat radiation can be caused to occur at all of the surfaces of the heat-radiating fins 3, thereby being capable of enhancing the heat radiation performance of the heat sink.

As described above, in the heat sink according to the fifth embodiment of the present invention, the heat-radiating fins 3 are arranged so that the refrigerant flows in parallel to the straight line connecting the apexes of the regular hexagon circumscribed to the heat-radiating fin 3. Therefore, the stagnation region 13 of the refrigerant is not generated, thereby being capable of further enhancing the heat radiation performance of the heat sink.

The invention claimed is:
1. A heat sink, comprising,
a plurality of heat-radiating fins provided on a base of the heat sink,
wherein the heat-radiating fins each have a projection-and-recess shape in which a sectional shape along the base is inscribed in a regular hexagon,
wherein projections of the projection-and-recess shape are held in contact with the regular hexagon, and
wherein, in adjacent heat-radiating fins, sides of the regular hexagon, with which the projections are held in contact, are opposed to each other in an entire region, and the heat-radiating fins are arranged so that side-to-side distances being distances between the sides opposed to each other at a distance are equal.

2. The heat sink according to claim 1, wherein the opposite side distance being a distance between the opposing sides of the regular hexagons is in a range from 2.0 mm to 3.1 mm.

3. The heat sink according to claim 2, wherein a recess depth being a distance between a bottom portion of a recess of the projection-and-recess shape and the side of the regular hexagon, with which the projection is held in contact, is in a range from 0.05 mm to 0.15 mm.

4. The heat sink according to claim 3,
wherein a projection-and-recess portion is formed on a surface of the base, on which the heat-radiating fins are provided, and
wherein the projection-and-recess portion has a zig-zag shape.

5. The heat sink according to claim 4, wherein the heat-radiating fins are arranged so that refrigerant can flows in parallel to a straight line connecting apexes of the regular hexagon.

6. The heat sink according to claim 3, wherein the heat-radiating fins are arranged so that refrigerant can flows in parallel to a straight line connecting apexes of the regular hexagon.

7. The heat sink according to claim 2,
wherein a projection-and-recess portion is formed on a surface of the base, on which the heat-radiating fins are provided, and
wherein the projection-and-recess portion has a zig-zag shape.

8. The heat sink according to claim 7, wherein the heat-radiating fins are arranged so that refrigerant can flows in parallel to a straight line connecting apexes of the regular hexagon.

9. The heat sink according to claim 2, wherein the heat-radiating fins are arranged so that refrigerant can flows in parallel to a straight line connecting apexes of the regular hexagon.

10. The heat sink according to claim 1, wherein a recess depth being a distance between a bottom portion of a recess of the projection-and-recess shape and the side of the regular hexagon, with which the projection is held in contact, is in a range from 0.05 mm to 0.15 mm.

11. The heat sink according to claim 10,
wherein a projection-and-recess portion is formed on a surface of the base, on which the heat-radiating fins are provided, and
wherein the projection-and-recess portion has a zig-zag shape.

12. The heat sink according to claim 11, wherein the heat-radiating fins are arranged so that refrigerant can flows in parallel to a straight line connecting apexes of the regular hexagon.

13. The heat sink according to claim 10, wherein the heat-radiating fins are arranged so that refrigerant can flows in parallel to a straight line connecting apexes of the regular hexagon.

14. The heat sink according to claim 1,
wherein a projection-and-recess portion is formed on a surface of the base, on which the heat-radiating fins are provided, and
wherein the projection-and-recess portion has a zig-zag shape.

15. The heat sink according to claim 14, wherein the heat-radiating fins are arranged so that refrigerant can flows in parallel to a straight line connecting apexes of the regular hexagon.

16. The heat sink according to claim 1, wherein the heat-radiating fins are arranged so that refrigerant can flows in parallel to a straight line connecting apexes of the regular hexagon.

* * * * *